(12) United States Patent
Weeks et al.

(10) Patent No.: US 6,611,002 B2
(45) Date of Patent: Aug. 26, 2003

(54) GALLIUM NITRIDE MATERIAL DEVICES AND METHODS INCLUDING BACKSIDE VIAS

(75) Inventors: T. Warren Weeks, Raleigh, NC (US); Edwin L. Piner, Cary, NC (US); Ricardo M. Borges, Morrisville, NC (US); Kevin J. Linthicum, Angier, NC (US)

(73) Assignee: Nitronex Corporation, Raleigh, NC (US)

( * ) Notice: Subject to any disclaimer, the term of this patent is extended or adjusted under 35 U.S.C. 154(b) by 0 days.

(21) Appl. No.: 09/792,414

(22) Filed: Feb. 23, 2001

(65) Prior Publication Data

US 2002/0117681 A1 Aug. 29, 2002

(51) Int. Cl.$^7$ ............................................... H01L 33/00
(52) U.S. Cl. ........................... 257/94; 257/96; 257/101; 257/103; 257/190; 257/191; 257/462; 438/173; 438/172; 438/778; 438/779
(58) Field of Search ........................... 257/94, 96, 103, 257/101, 190, 191, 192, 194, 462, 347; 438/173, 172, 778, 779

(56) References Cited

U.S. PATENT DOCUMENTS 4,985,742 A * 1/1991 Pankove ...................... 357/34
5,192,987 A 3/1993 Khan et al.

(List continued on next page.)

FOREIGN PATENT DOCUMENTS

| DE | 199 31 300 A1 | 2/2000 |
|---|---|---|
| EP | 0 740 376 A1 | 10/1996 |
| EP | 0 852 416 A1 | 7/1998 |
| EP | 0 951 055 A2 | 10/1999 |
| FR | 2 809 534 A | 11/2001 |
| JP | 09326534 A | 12/1997 |
| JP | 10135519 A * | 5/1998 |
| JP | 10242584 A | 9/1998 |
| WO | WO00/33365 A1 | 6/2000 |
| WO | WO01/37327 A1 | 5/2001 |
| WO | WO01/43174 A2 | 6/2001 |
| WO | WO01/47002 A2 | 6/2001 |
| WO | WO01/59819 A1 | 8/2001 |

*Primary Examiner*—Nathan J. Flynn
*Assistant Examiner*—Remmon R. Fordé
(74) *Attorney, Agent, or Firm*—Wolf, Greenfield & Sacks, P.C.

(57) ABSTRACT

The invention includes providing gallium nitride material devices having backside vias and methods to form the devices. The devices include a gallium nitride material formed over a substrate, such as silicon. The device also may include one or more non-conducting layers between the substrate and the gallium nitride material which can aid in the deposition of the gallium nitride material. A via is provided which extends from the backside of the device through the non-conducting layer(s) to enable electrical conduction between an electrical contact deposited within the via and, for example, an electrical contact on the topside of the device. Thus, devices of the invention may be vertically conducting. Exemplary devices include laser diodes (LDs), light emitting diodes (LEDs), power rectifier diodes, FETs (e.g., HFETs), Gunn-effect diodes, and varactor diodes, among others.

51 Claims, 8 Drawing Sheets

U.S. PATENT DOCUMENTS

| | | | |
|---|---|---|---|
| 5,296,395 A | 3/1994 | Khan et al. | |
| 5,389,571 A | 2/1995 | Takeuchi et al. | |
| 5,393,993 A | 2/1995 | Edmond et al. | |
| 5,438,212 A | 8/1995 | Okaniwa | |
| 5,523,589 A | 6/1996 | Edmond et al. | |
| 5,739,554 A | 4/1998 | Edmond et al. | |
| 5,760,426 A | 6/1998 | Marx et al. | |
| 5,838,706 A | 11/1998 | Edmond et al. | |
| 5,864,171 A | 1/1999 | Yamamoto et al. | |
| 5,874,747 A * | 2/1999 | Redwing et al. | 257/77 |
| 5,905,275 A * | 5/1999 | Nunoue et al. | 257/95 |
| 5,928,421 A | 7/1999 | Yuri et al. | |
| 6,045,626 A | 4/2000 | Yano et al. | |
| 6,051,849 A | 4/2000 | Davis et al. | |
| 6,060,730 A * | 5/2000 | Tsutsui | 257/103 |
| 6,064,082 A * | 5/2000 | Kawai et al. | 257/192 |
| 6,121,121 A | 9/2000 | Koide | |
| 6,121,634 A * | 9/2000 | Saito et al. | 257/86 |
| 6,153,010 A | 11/2000 | Kiyoku et al. | |
| 6,177,688 B1 | 1/2001 | Linthicum et al. | |
| 6,201,262 B1 | 3/2001 | Edmond et al. | |
| 6,239,033 B1 * | 5/2001 | Kawai | 438/693 |
| 6,255,198 B1 | 7/2001 | Linthicum et al. | |
| 6,261,929 B1 | 7/2001 | Gehrke et al. | |
| 6,265,289 B1 | 7/2001 | Zheleva et al. | |
| 6,355,497 B1 | 3/2002 | Romano et al. | |

* cited by examiner

GALLIUM NITRIDE MATERIAL DEVICES AND METHODS INCLUDING BACKSIDE VIAS

FIELD OF INVENTION

The invention relates generally to semiconductor materials and, more particularly, to gallium nitride materials and methods of producing gallium nitride materials.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others. Accordingly, gallium nitride materials are being widely investigated in many semiconductor device applications such as transistors, field emitters, and optoelectronic devices.

Gallium nitride materials have been formed on a number of different substrates including silicon carbide (SiC), sapphire, and silicon. Silicon substrates are readily available and relatively inexpensive, and silicon processing technology has been well developed. However, forming gallium nitride materials on silicon substrates to produce semiconductor devices presents challenges which arise from differences in the lattice constant, thermal expansion, and band gap between silicon and gallium nitride.

Many semiconductor devices include at least two electrical contacts which, for example, provide electrically conducting contact to terminals of a power supply. In a typical device, current flows from a first contact (e.g., the anode) on the device to a second contact (e.g., the cathode) on the device. In certain devices, both the first and the second contacts are positioned on a topside (i.e., upper surface) of the device. Such devices are referred to as horizontally conducting devices because current flows horizontally through the device from the first contact to the second contact. In other devices, the first contact is positioned on the topside of the device and the second contact is positioned on a backside (i.e., bottom surface) of the device. Such devices are referred to as vertically conducting devices. In some cases, vertically conducting devices may be made smaller than an otherwise similar functioning horizontal device because horizontal devices include multiple topside contacts while vertical devices may require only one topside contact. Reducing device size may be advantageous because it increases the number of devices produced per unit area (wafer). Thus, vertically conducting devices may be preferred over horizontally conducting devices in certain applications.

SUMMARY OF INVENTION

The invention includes providing gallium nitride material devices having backside vias and methods to form the devices. The devices include a gallium nitride material formed over a substrate, such as silicon. The device also may include one or more non-conducting layers between the substrate and the gallium nitride material which can aid in the deposition of the gallium nitride material. A via is provided which extends from the backside of the device through the non-conducting layer(s) to enable electrical conduction between an electrical contact deposited within the via and, for example, an electrical contact on the topside of the device. Thus, devices of the invention may be vertically conducting. Exemplary devices include laser diodes (LDs), light emitting diodes (LEDs), power rectifier diodes, FETs (e.g., HFETs), Gunn-effect diodes, and varactor diodes, amongst others.

In one aspect, the invention provides a semiconductor structure. The semiconductor structure includes a substrate having at least one via extending from a backside of the substrate and an electrical contact formed in the via. The semiconductor structure also includes a gallium nitride material region formed over the substrate.

In another aspect, the invention provides a semiconductor structure. The semiconductor structure includes a silicon substrate having at least one via extending from a backside of the silicon substrate. The semiconductor structure also includes a gallium nitride material region formed over the silicon substrate.

In another aspect, the invention provides a vertically conducting semiconductor device. The semiconductor device includes a silicon substrate and a gallium nitride material region formed over the silicon substrate. The semiconductor device is capable of vertical conduction.

In another aspect, the invention provides a semiconductor structure. The semiconductor structure includes a silicon substrate and a gallium nitride material region formed over the silicon substrate. The semiconductor structure also includes a non-conducting layer formed between the gallium nitride material region and the silicon substrate, and an electrical contact formed within a via extending from a backside of the semiconductor structure through the non-conducting layer.

In another aspect, the invention provides a method of forming a semiconductor structure. The method includes forming a gallium nitride material region over a substrate, forming a via extending from a backside of the semiconductor structure, and forming an electrical contact within the via.

In another aspect, the invention provides a method of forming a semiconductor structure. The method includes forming a gallium nitride material region over a silicon substrate, and forming a via extending from a backside of the silicon substrate.

Among other advantages, the invention enables the production of vertically conducting gallium nitride material devices even when the device includes a non-conducting layer. In particular, it is possible to produce vertically conducting devices with silicon substrates that include such non-conducting layers. Silicon substrates are particularly desirable because they are readily available, relatively inexpensive, and may be processed using known techniques.

Furthermore, the vertical conducting devices of the invention may be formed with smaller dimensions than similar functioning horizontal devices due to the presence of fewer topside contacts on vertically conducting devices. Utilizing smaller device dimensions may enable more devices to be formed on a given wafer.

Also, the backside contact formed using the methods of the invention may have other advantageous functions. In some cases, the backside contact can function as a heat sink which removes thermal energy generated during the operation of the device. Also, the backside contact may function as a reflective layer which can enhance output efficiencies of optoelectronic devices.

It should be understood that not every embodiment of the invention has all of the advantages described herein. Other advantages, aspects, and features of the invention will become apparent from the following detailed description of the invention when considered in conjunction with the accompanying drawings.

DETAILED DESCRIPTION OF THE INVENTION

The invention provides gallium nitride material devices including backside vias and methods to form the devices.

Figure 1:
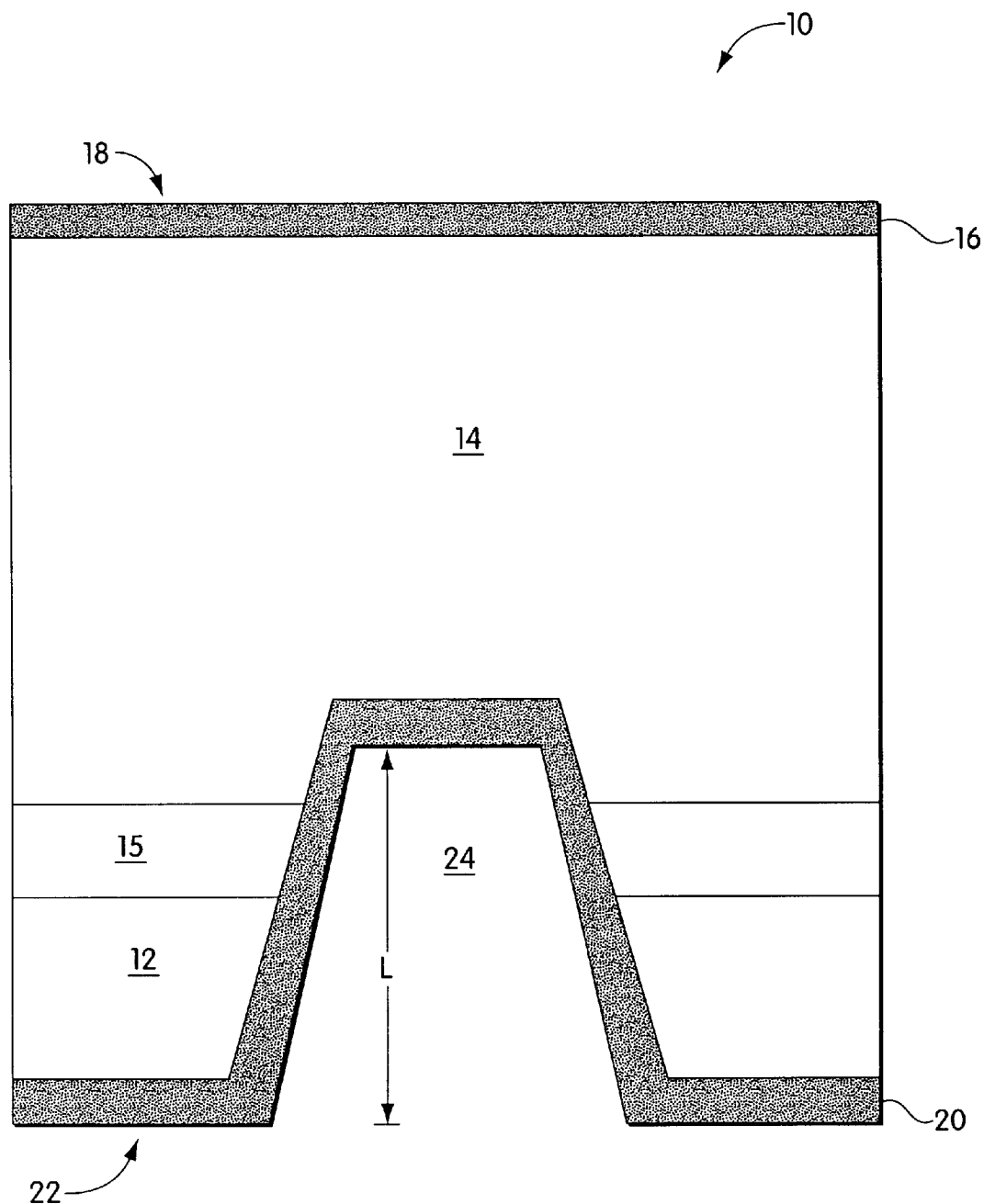
FIG. 1 illustrates a semiconductor device including a backside via according to one embodiment of the present invention.

Referring to FIG. 1, a semiconductor device 10 according to one embodiment of the invention is shown. Semiconductor device 10 includes a substrate 12 and a gallium nitride material device region 14 formed over the substrate. As described further below, device structures are typically formed, at least in part, within gallium nitride material region 14. Device 10 further includes a non-conducting layer 15 formed on substrate 12, for example, to facilitate the subsequent deposition of gallium nitride material device region 14. A topside electrical contact 16 (on a topside 18 of the device) and a backside electrical contact 20 (on a backside 22 of the device) are provided for connection to an external power supply that powers the device. Backside contact 20 is deposited within a via 24 that extends from backside 22 of the device. Via 24 extends through non-conducting layer 15 and into a conducting region (e.g., device region 14) within device 10. As a result of the deposition of backside contact 20 within via 24, current can flow between the backside contact and topside contact 16 through device region 14 without being blocked by non-conducting layer 15. Thus, vertical conduction through device 10 between backside contact 20 and topside contact 16 may be achieved despite the presence of non-conducting layer 15.

As used herein, "non-conducting" refers to a layer that prevents current flow or limits current flow to negligible amounts in one or more directions. "Non-conducting" layers, for example, may be formed of non-conductor materials, or may be formed of semiconductor materials which have a band sufficiently offset from the layer adjacent the "non-conducting" layer. A "non-conducting" layer may be conductive in and of itself, but may still be non-conducting (e.g, in a vertical direction) as a result of a band offset or discontinuity with an adjacent layer. As used herein, "vertical conduction" refers to electrical current flow in a vertical direction within a device. "Vertical conduction" may be between backside contact and topside contact or may be between different layers within the device that are separated vertically.

It should be understood that when a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate. As shown in the figures, the term "topside" refers to the upper surface of the device and the term "backside" refers to the bottom surface of the device. Thus, the topside is opposite the backside of the device.

In certain preferred embodiments, substrate 12 is a silicon substrate. A silicon substrate, as used herein, refers to any substrate that includes a silicon layer at its topside (i.e., upper) surface. Examples of suitable silicon substrates include substrates that are composed of bulk silicon (e.g., silicon wafers), silicon-on-insulator (SOI) substrates, silicon-on-sapphire substrates (SOS), and separation by implanted oxygen (SIMOX) substrates, amongst others. High-quality single-crystal silicon substrates are used in many embodiments. Silicon substrates 12 having different crystallographic orientations may be used. In some cases, silicon (111) substrates are preferred. In other cases, silicon (100) substrates are preferred.

It should be understood that in other embodiments, substrates other than silicon substrates may be used such as sapphire and silicon carbide substrates.

Substrate 12 may have any dimensions and its particular dimensions are dictated by the application. Suitable diameters include, but are not limited to, 2 inches (50 mm), 4 inches (100 mm), 6 inches (150 mm), and 8 inches (200 mm). In some embodiments, silicon substrate 12 is relatively thick, for example, greater than 250 microns. Thicker substrates are generally able to resist bending which can occur, in some cases, in thinner substrates. In some embodiments, silicon substrate 12 is preferably thin, for example less than 100 microns, to facilitate the formation of via 24 therethrough.

Non-conducting layer 15 may be formed on substrate 12 prior to the deposition of gallium nitride material device region 14, for example, to accomplish one or more of the following: reducing crack formation in gallium nitride material device region 14 by lowering thermal stresses arising from differences between the thermal expansion rates of gallium nitride material device region 14 and substrate 12; reducing defect formation in gallium nitride material device region 14 by lowering lattice stresses arising from differences between the lattice constants of gallium nitride material device region 14 and substrate 12; and, increasing conduction between substrate 12 and gallium nitride material device region 14 by reducing differences between the band gaps of substrate 12 and gallium nitride material device region 14. It should be understood that non-conducting layer 15 also may be formed between substrate 12 and gallium nitride material device region for a variety of other reasons.

The presence of non-conducting layer 15 may be particularly preferred when utilizing silicon substrates.

The composition of non-conducting layer 15 depends, at least in part, upon the type of substrate and the composition of gallium nitride material device region 14. In some embodiments which utilize a silicon substrate, non-conducting layer 15 may preferably comprise a compositionally-graded transition layer having a composition that is varied across at least a portion of the layer. Suitable compositionally-graded transition layers, for example, have been described in co-pending, commonly-owned, U.S. patent application Ser. No. 09/736,972, entitled "Gallium Nitride Materials and Methods," filed on Dec. 14, 2000, which is incorporated herein by reference. Compositionally-graded transition layers are particularly effective in reducing crack formation in gallium nitride material device region 14 by lowering thermal stresses that result from differences in thermal expansion rates between the gallium nitride material and substrate 12 (e.g., silicon). In some embodiments, when non-conducting layer 15 is compositionally-graded, layer 15 is composed of an alloy of gallium nitride such as $Al_xIn_yGa_{(1-x-y)}N$, $Al_xGa_{(1-x)}N$, or $In_yGa_{(1-y)}N$. In these embodiments, the concentration of at least one of the elements (e.g., Ga, Al, In) of the alloy is typically varied across at least a portion of the cross-sectional thickness of the layer.

In other embodiments, non-conducting layer 15 has a constant (i.e., non-varying) composition across its thickness. Such non-conducting layers include buffer layers and intermediate layers. Suitable intermediate layers, for example, have been described in U.S. patent application Ser. No. 09/736,972, referenced above. In some embodiments, non-conducting layer 15 has a constant composition of a gallium nitride alloy such as $Al_xIn_yGa_{(1-x-y)}N$, $Al_xGa_{(1-x)}N$, or $In_yGa_{(1-y)}N$.

In the illustrative embodiment, a single non-conducting layer 15 is shown between substrate 12 and gallium nitride material device region 14. Other embodiments may include more than one non-conducting layer. For example, device 10 may include a non-conducting compositionally-graded transition layer and a non-conducting intermediate layer. It also should be understood that in some embodiments, one or more conducting layers also may be present between substrate 12 and gallium nitride material device region 14 which may accomplish one or more of the above-described features of non-conducting layers. For example, the compositionally-graded transition layer may be conducting in certain cases.

In the embodiment of FIG. 1, via 24 extends through non-conducting layer 15 of substrate 12 so that vertical conduction can occur in device 10. Thus, at a minimum, via 24 has a length (L) sufficient to create a conducting vertical path between topside contact 16 and backside contact 20. Via 24, for example, may extend to a position within gallium nitride material device region 14 to form such a conducting path. In some cases, it may be preferable to have via 24 extend to an etch-stop layer (e.g., See 46, FIG. 5) within gallium nitride material device region 14, to facilitate processing as described further below. In certain embodiments, via 24 may extend to a position below gallium nitride material device layer—for example, within an upper portion of a doped, conductive transition layer and, thus, a vertical conducting path is formed. In some cases, via 24 may extend to a source region or a drain region formed within device 10.

The exact dimensions and shape of via 24 depend upon the application. A typical cross-sectional area of via is about 100 microns by about 100 microns at backside 22. It may be preferable for via 24 to be tapered inward, as shown, thus giving the via a cone shape. The inward taper can facilitate deposition of backside contact 20 on side walls 28 of via 24.

In FIG. 1, device 10 includes a single via 24. Other embodiments, however, as described further below and shown in FIGS. 2–3 may include more than one via.

As used herein, the phrase "electrical contact" or "contact" refers to any conducting structure on the semiconductor device that may be effectively contacted by a power source including electrodes, terminals, contact pads, contact areas, contact regions and the like. Backside contact 20 and topside contact 16 are formed of conducting materials including certain metals. Any suitable conducting material known in the art may be used. The composition of contacts 16, 20 may depend upon the type of contact. For example, contacts 16, 20 may contact n-type material or p-type material. Suitable metals for n-type contacts include titanium, nickel, aluminum, gold, copper, and alloys thereof. Suitable metals for p-type contacts include nickel, gold, and titanium, and alloys thereof.

Contacts 16, 20 have a thickness sufficient to ensure that the contact is electrically conductive across its entire physical area. Suitable thicknesses for contacts 16, 20, for example, are between about 0.05 microns and about 10 microns. In some cases, the thickness of backside contact 20 may vary over its area because of uneven deposition on side walls 28 of via 24. The surface areas of backside contact 20 and topside contact 16 are generally sufficient so that the contacts can be contacted by terminals of an appropriate power source through wire bonding, air bridging and the like. In certain preferred embodiments, backside contact 20 substantially extends only over backside and does not, for example, extend over sides 30 of device 10. Thus, in these preferred embodiments, sides 30 are substantially free of backside contact 20.

In some embodiments, backside contact 20 also may function as an effective heat sink. In these embodiments, backside contact 20 removes thermal energy generated during the operation of the device. This may enable device 10 to operate under conditions which generate amounts of heat that would otherwise damage the device. In particular, laser diodes that operate at high current densities may utilize backside contact 20 as a heat sink. Backside contact 20 may be specifically designed to enhance thermal energy removal. For example, backside contact 20 may be composed of materials such as copper and gold, which are particularly effective at removing heat. Also, backside contact 20 and via 24 may be designed so that a large surface area is in contact with device region 14—for example, by including multiple vias and/or vias that extend significantly into device region 14.

In some embodiments, such as when device 10 is an opto-electronic device, backside contact 20 can function as a reflective layer. By efficiently reflecting internally emitted light away from substrate 12, backside contact 20 can direct the emitted light out of topside 18 and sides 30 of device 10. Thus, the output efficiency of the device may be enhanced. In particular, laser diodes and light emitting diodes can benefit from utilizing the reflective properties of backside contact 20. To enhance the ability of backside contact 20 to reflect light, via 24 is formed such that the backside contact extends proximate a light emitting active layer (e.g., 38, FIG. 4; 50, FIG. 5).

Gallium nitride material device region 14 comprises at least one gallium nitride material layer. In some cases, gallium nitride material device region 14 includes only one gallium nitride material layer. In other cases, as described further below and shown in FIGS. 4–8, gallium nitride material device region 14 includes more than one gallium nitride material layer. The different layers can form different regions of the semiconductor structure. Gallium nitride material region also may include one or more layers that do not have a gallium nitride material composition such as oxide layers or metallic layers.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_b N_{(1-a-b)}$), aluminum indium gallium arsenide phosporide nitride ($Al_xIn_yGa_{(1-x-y)} AS_aP_b N_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in U.S. patent application Ser. No. 09/736,972, incorporated herein.

Gallium nitride material region 14 is of high enough quality so as to permit the formation of devices therein. Preferably, gallium nitride material region 14 has a low crack level and a low defect level. As described above, non-conducting layer 15 may reduce crack and/or defect formation. In some embodiments, gallium nitride material region 14 has about $10^9$ defects/$cm^2$. Gallium nitride materials having low crack levels have been described in U.S. patent application Ser. No. 09/736,972, referenced above. In some cases, gallium nitride material region 14 has a crack level of less than 0.005 $\mu m/\mu m^2$. In some cases, gallium nitride material has a very low crack level of less than 0.001 $\mu m/\mu m^2$. In certain cases, it may be preferable for gallium nitride material region 14 to be substantially crack-free as defined by a crack level of less than 0.0001 $\mu m/\mu m^2$.

In certain cases, gallium nitride material region 14 includes a layer or layers which have a monocrystalline structure. In some preferred cases, gallium nitride material region 14 includes one or more layers having a Wurtzite (hexagonal) structure.

The thickness of gallium nitride material device region 14 and the number of different layers are dictated, at least in part, by the requirements of the specific application. At a minimum, the thickness of gallium nitride material device region 14 is sufficient to permit formation of the desired device. Gallium nitride material device region 14 generally has a thickness of greater than 0.1 micron, though not always. In other cases, gallium nitride material region 14 has a thickness of greater than 0.5 micron, greater than 0.75 micron, greater than 1.0 microns, greater than 2.0 microns, or even greater than 5.0 microns.

Device 10 may be formed using known processing techniques. Non-conducting layer 15 and gallium nitride material device region 14 may be deposited on substrate 12, for example, using metalorganic chemical vapor deposition (MOCVD), molecular beam epitaxy (MBE), hydride vapor phase epitaxy (HVPE), amongst other techniques. In some cases, an MOCVD process may be preferred. A suitable MOCVD process to form a compositionally-graded non-conducting layer 15 and gallium nitride material device region 14 over a silicon substrate 12 has been described in U.S. patent application Ser. No. 09/736,972, referenced above. When gallium nitride material device region 14 has different layers, in some cases it is preferable to use a single deposition step (e.g., an MOCVD step) to form the entire device region 14. When using the single deposition step, the processing parameters are suitably changed at the appropriate time to form the different layers. In certain preferred cases, a single growth step may be used to form non-conducting layer 15 and gallium nitride material device region 14.

In some cases, it may be preferable to grow device region 14 using a lateral epitaxial overgrowth (LEO) technique that involves growing an underlying gallium nitride layer through mask openings and then laterally over the mask to form the gallium nitride material device region, for example, as described in U.S. Pat. No. 6,051,849, which is incorporated herein by reference. In some cases, it may be preferable to grow device region 14 using a pendeoepitaxial technique that involves growing sidewalls of gallium nitride material posts into trenches until growth from adjacent sidewalls coalesces to form a gallium nitride material region, for example, as described in U.S. Pat. No. 6,177,688, which is incorporated herein by reference.

Conventional etching techniques may be used to form via 24. Suitable techniques include wet chemical etching and plasma etching (i.e., RIE, ICP etching, amongst others). Different etching techniques may be utilized when etching through different layers of device 10. For example, a fluorine-based RIE process may be used to etch through substrate 12 and a chlorine-based RIE process may be used to etch through gallium nitride device region 14 and/or non-conducting layers 15. A pre-determined etching time may be used to form via 24 with the desired dimensions. In other cases, an etch stop layer (e.g., See 46, FIG. 5), which has a composition that is not readily etched by the technique being used, may be provided within device 10 to stop etching so that precise control over the etching time is not required to form via 24 with desired dimensions.

Backside contact 20 and topside contact 16 may be deposited using known techniques suitable for depositing conducting materials such as metals. Such techniques include sputtering, electron beam deposition, and evaporation, amongst others. In some cases, a series of layers having different metallic compositions are deposited successively to form contacts 16, 20. In some of these cases, an annealing technique is used to yield equilibration of the contact composition. Because backside contact 20 is deposited within via 24, the deposition technique should be performed in a manner that provides sufficient coverage within via 24. Thus, deposition times for backside contact 20 may be longer than for topside contact 16.

Figure 2:
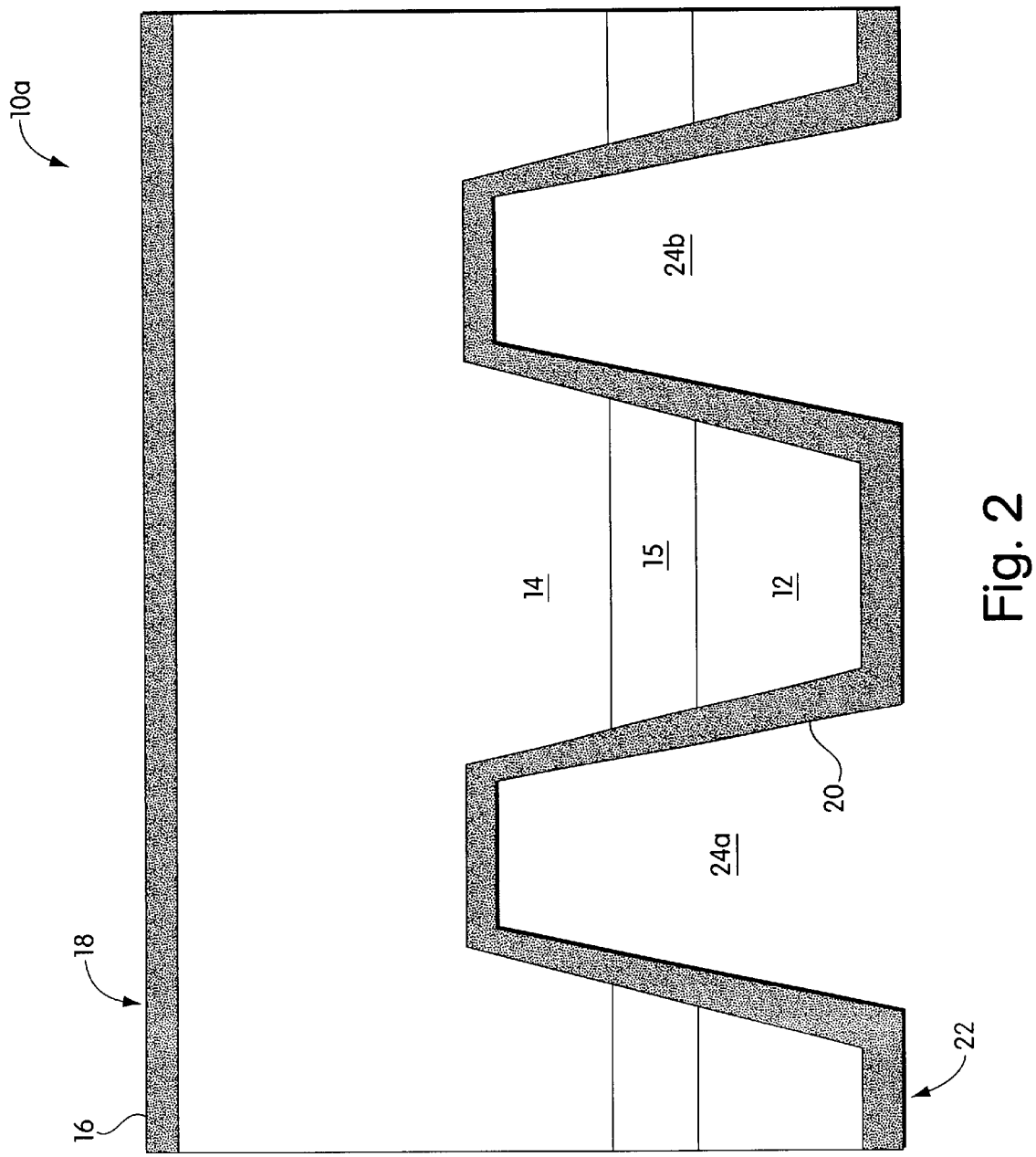
FIG. 2 illustrates a semiconductor device including multiple backside vias according to another embodiment of the present invention.

FIG. 2 illustrates device 10a including multiple vias 24a, 24b according to another embodiment of the present invention. A single backside contact 20 is formed in and across both vias 24a, 24b. Using multiple vias 24a, 24b as shown in FIG. 2 may enhance heat removal, improve light reflection, and increase vertical conduction.

Figure 3:
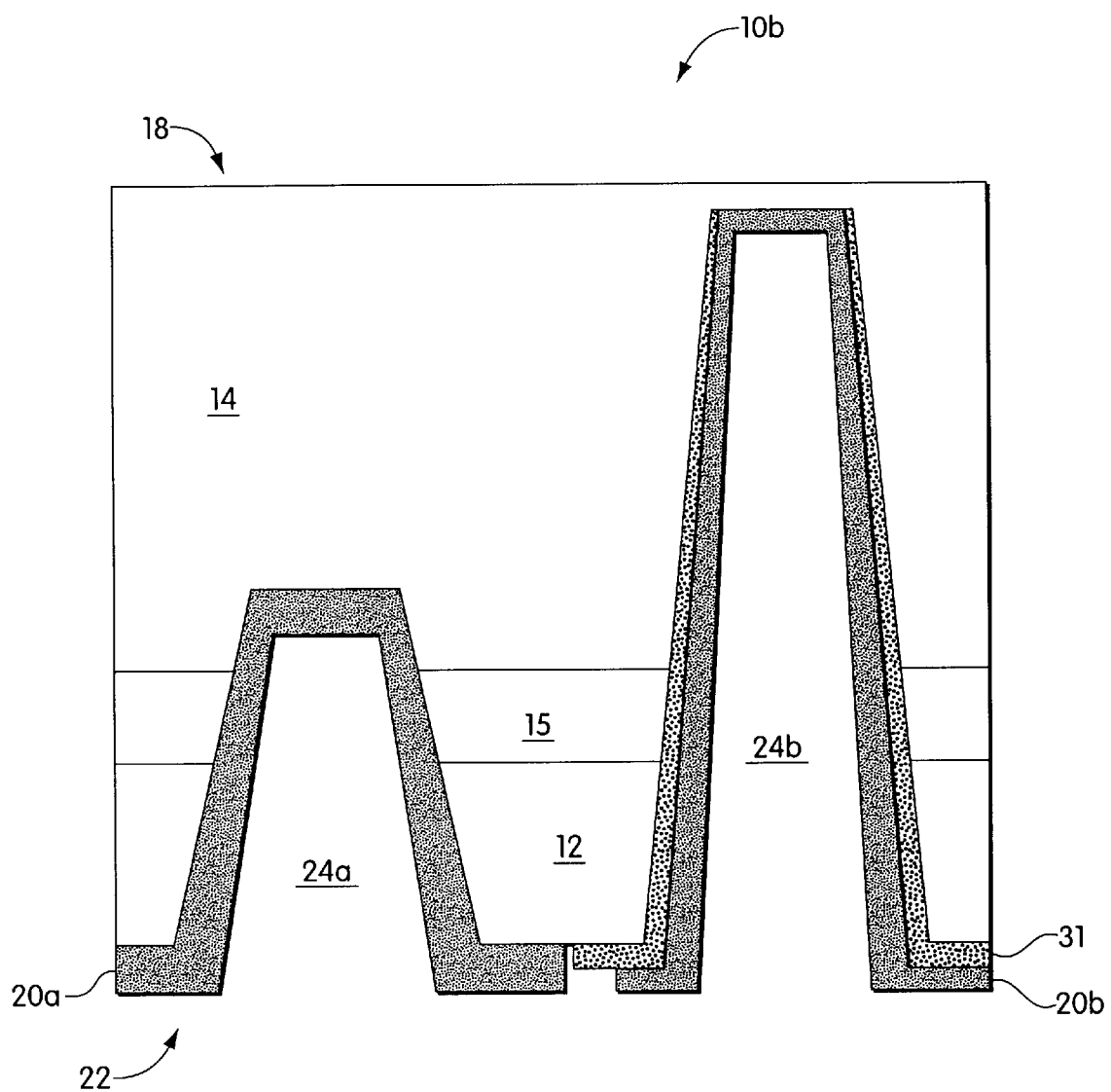
FIG. 3 illustrates a semiconductor device including multiple backside vias and no topside vias according to another embodiment of the present invention.

FIG. 3 illustrates device 10b including multiple vias 24a, 24b according to another embodiment of the present invention. A first backside contact 20a is formed in via 24a and a second backside contact 20b is formed in via 24b. A dielectric layer 31 may be used, for example, to electrically isolate portions of backside contact 20b to prevent shorting of device 10. Suitable compositions for dielectric layer 31 include silicon oxide and silicon nitride. The embodiment of FIG. 3 does not have a topside contact (16 in FIG. 1). The embodiment of FIG. 3 may be utilized in cases when it is not desirable to have a topside contact such as for surface mounted devices.

It should be understood that the invention also includes devices having backside vias and backside contacts with other configurations than those illustrated herein. For example, backside contact 20 may extend to an active region within gallium nitride material device region 14 such as a source region or a drain region. Also, backside contact 20 may extend substantially through the thickness of the device so that the backside contact also forms a contact on topside 18 of the device.

Any suitable semiconductor device known in the art including electronic and optical devices may utilize features of the invention. In many cases, the device may be formed entirely within gallium nitride material region 14 (i.e., the only active device regions are within gallium nitride material region 14). In other cases, the device is formed only in part within gallium nitride material region 14 and is also formed in other regions such as substrate 12.

Exemplary devices include laser diodes (LDs), light emitting diodes (LEDs), power rectifier diodes, FETs (e.g., HFETs), Gunn-effect diodes, varactor diodes, amongst others. FIGS. 4–8 illustrate examples of gallium nitride material devices according to the invention. It should be understood, however, that devices having other structures are also within the scope of the invention.

Figure 4:
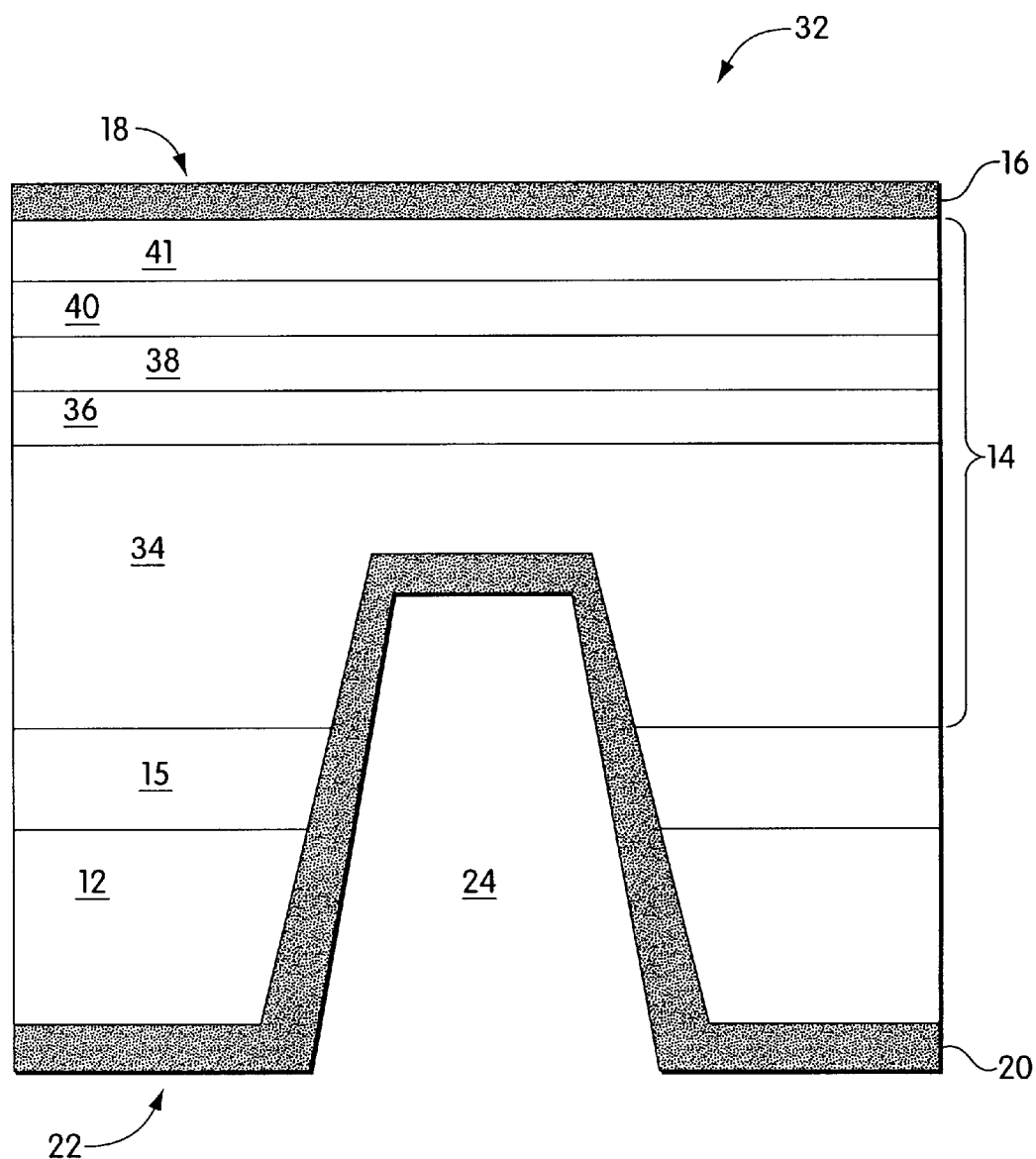
FIG. 4 illustrates an LED according to another embodiment of the present invention.
Figure 8:
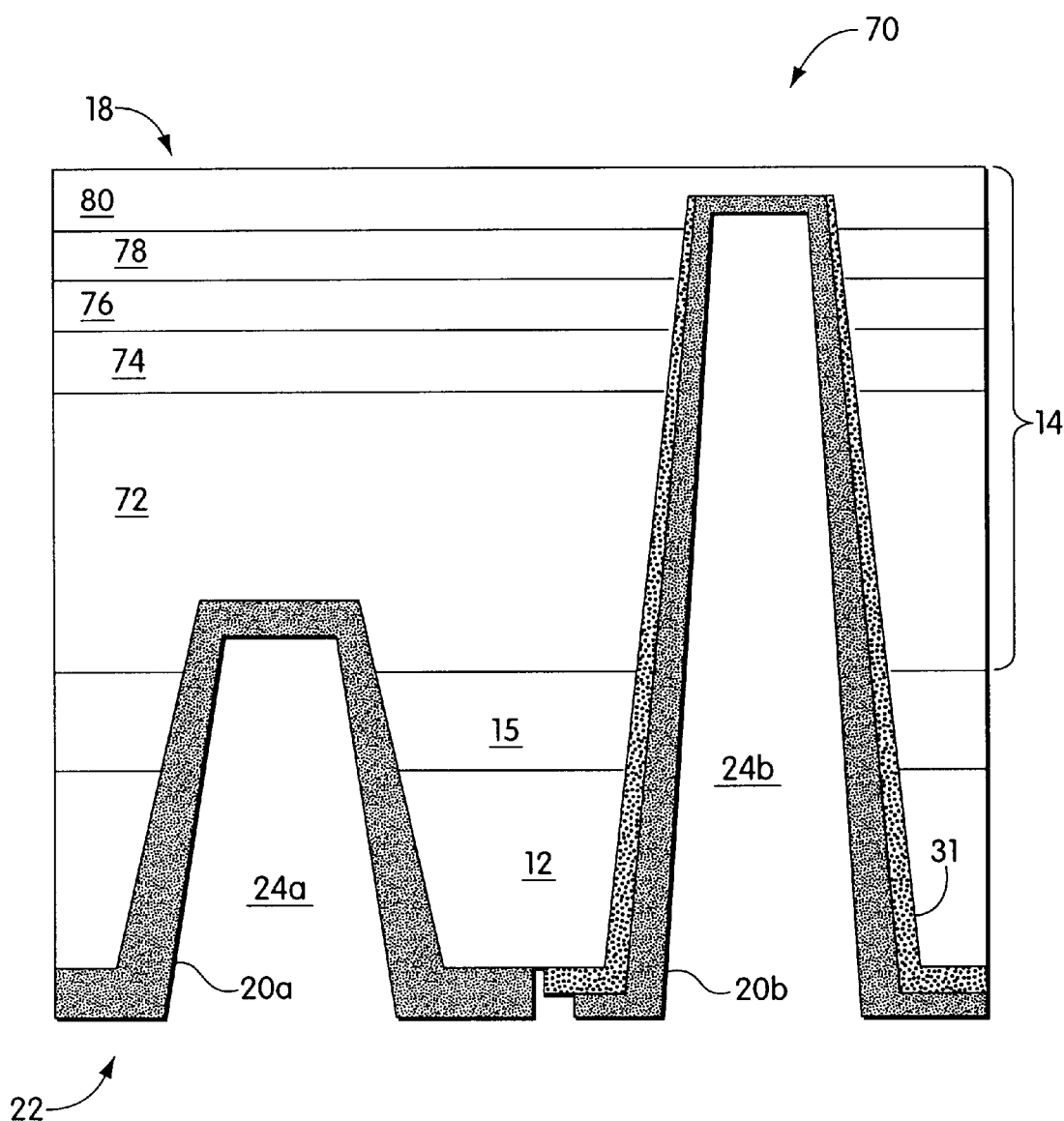
FIG. 8 illustrates an LED including multiple backside vias and no topside vias according to another embodiment of the present invention.

FIG. 4 illustrates an exemplary LED 32 according to one embodiment of the present invention. LED 32 includes gallium nitride material device region 14 formed on non-conducting layer 15. Non-conducting layer 15 may be compositionally-graded and is formed on silicon substrate 12. In the illustrative embodiment, the following layers comprise gallium nitride material device region 14 in succession: a silicon-doped GaN layer 34, a silicon-doped $Al_xGa_{(1-x)}N$ layer 36 (containing 0–20% by weight Al), a GaN/InGaN single or multiple quantum well 38, a magnesium-doped $Al_xGa_{(1-x)}N$ layer 40 (containing 10–20% by weight Al), and a magnesium-doped GaN layer 41. Via 24 extends from backside 22 to a position within GaN layer 34. Topside contact 16 is formed of a p-type metal and backside contact 20 is formed of an n-type metal. LED 32 may be provided as a variety of different structures including: a double heterostructure (e.g., Al>0% in layer 36), a single heterostructure (e.g., Al=0% in layer 36), a symmetric structure, or an asymmetric structure. It should be understood that LEDs having a variety of different structures may also be provided one of which is shown in FIG. 8.

Figure 5:
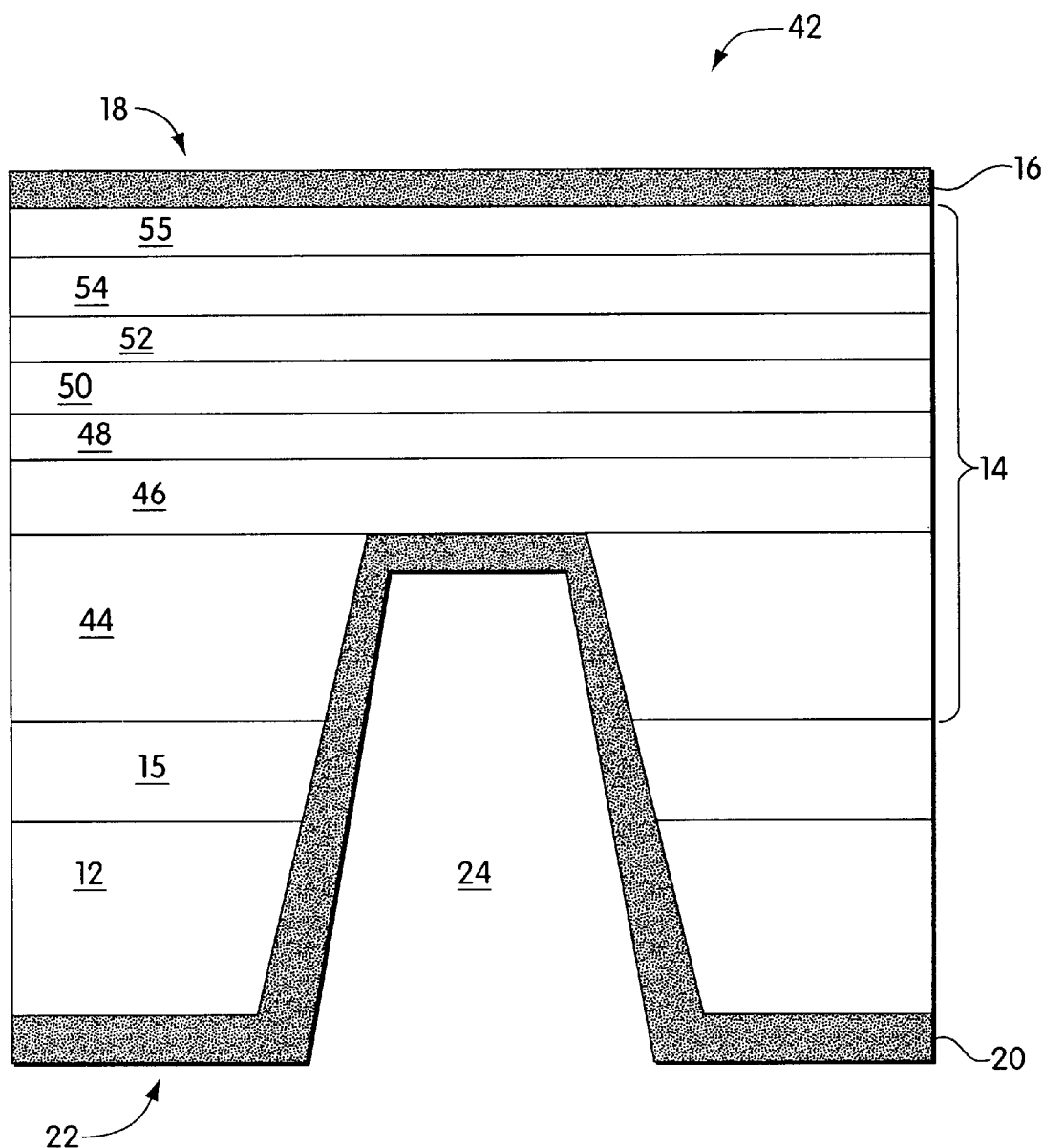
FIG. 5 illustrates a laser diode according to another embodiment of the present invention.

FIG. 5 illustrates an exemplary laser diode 42 according to one embodiment of the present invention. Laser diode 42 includes gallium nitride material device region 14 formed on non-conducting layer 15. Non-conducting layer 15 may be compositionally-graded and is formed on silicon substrate 12. In the illustrative embodiment, the following layers comprise gallium nitride material device region 14 in succession: a silicon-doped GaN layer 44, a silicon-doped $Al_xGa_{(1-x)}N$ layer 46 (containing 5–30% by weight Al), a silicon-doped $Al_xGa_{(1-x)}N$ layer 48 (containing 0–20% by weight Al), a GaN/InGaN single or multiple quantum well 50, a magnesium-doped $Al_xGa_{(1-x)}N$ layer 52 (containing 5–20% by weight Al), a magnesium-doped $Al_xGa_{(1-x)}N$ layer 54 (containing 5–30% by weight Al), and a magnesium-doped GaN layer 55. Via 24 extends from backside 22 to $Al_xGa_{(1-x)}N$ layer 46 which functions as an etch-stop layer. Topside contact 16 is formed of a p-type metal and backside contact 20 is formed of an n-type metal. It should be understood that laser diodes having a variety of different structures may also be provided.

Figure 6:
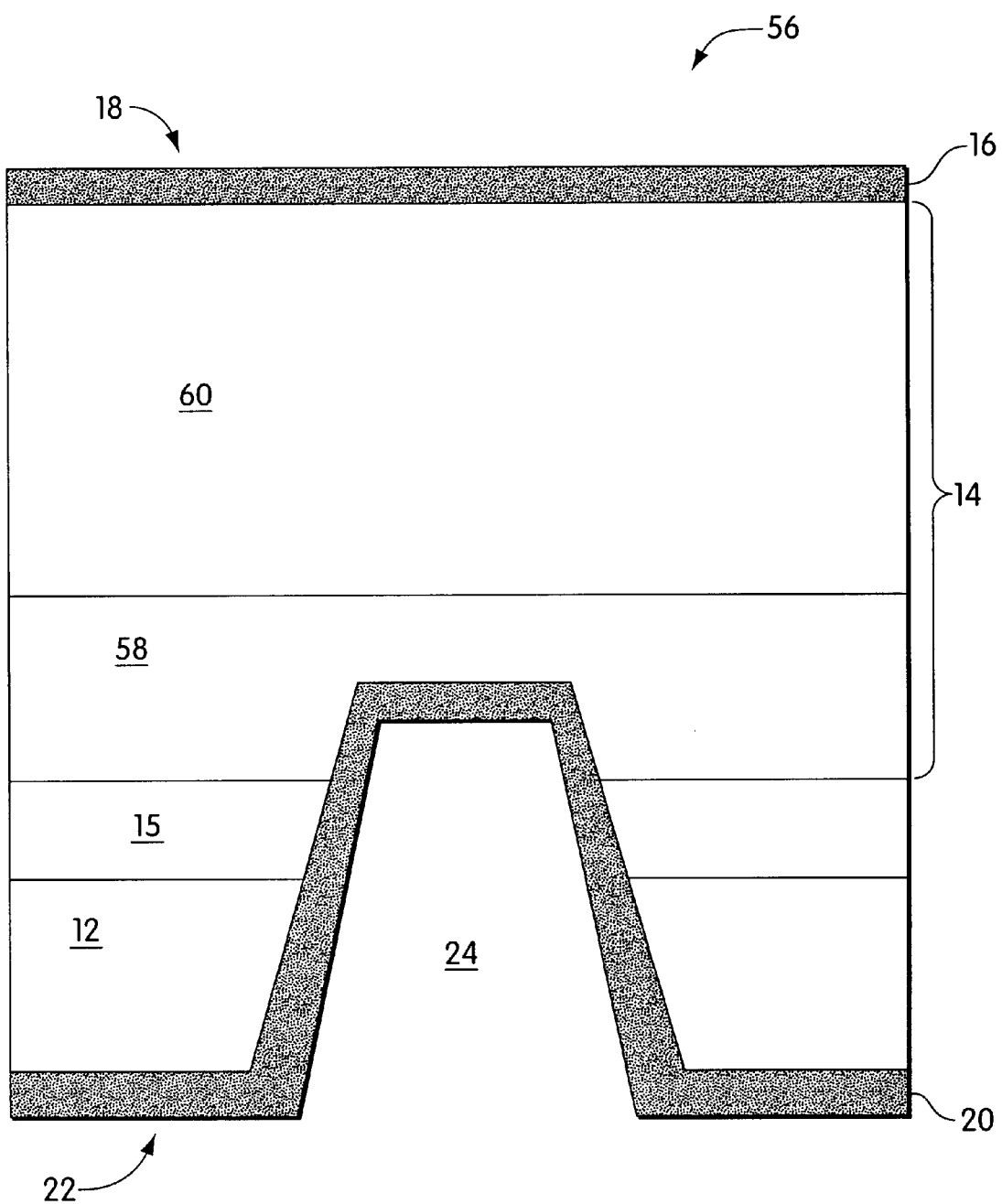
FIG. 6 illustrates a power rectifier diode according to another embodiment of the present invention.

FIG. 6 illustrates a power rectifier diode 56 according to one embodiment of the present invention. Diode 56 includes gallium nitride material device region 14 formed on non-conducting layer 15. Non-conducting layer 15 may be compositionally-graded and is formed on silicon substrate 12. In the illustrative embodiment, the following layers comprise gallium nitride material device region 14 in succession: a silicon-doped GaN layer 58 and an intrinsic GaN layer 60. Via 24 extends from backside 22 to a position within GaN layer 58. Topside contact 16 is formed of a rectifying metal and backside contact 20 is formed of an n-type metal. It should be understood that diodes having a variety of different structures may also be provided.

Figure 7:
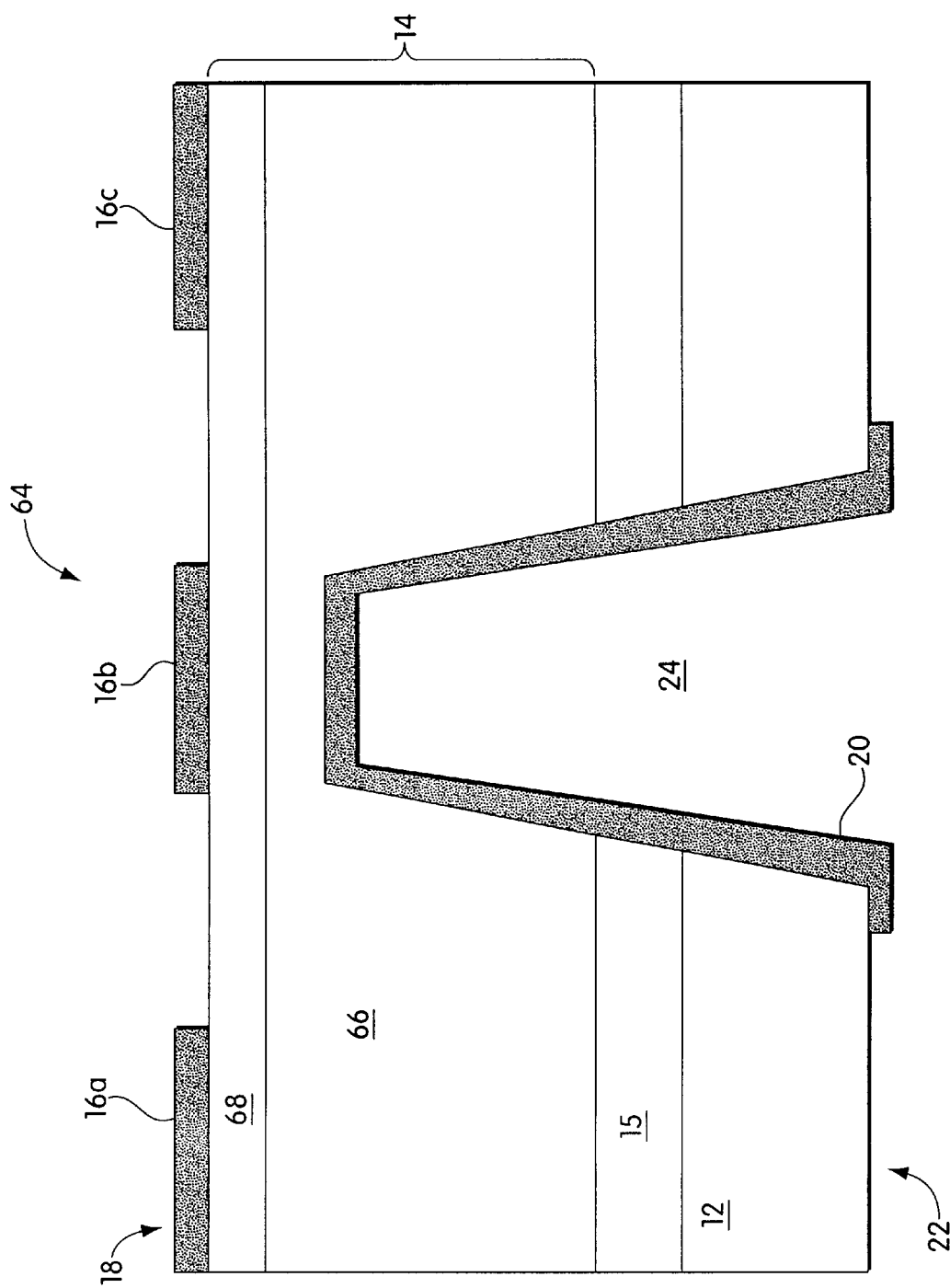
FIG. 7 illustrates a double-gate HFET according to another embodiment of the present invention.

FIG. 7 illustrates a double-gated HFET 64 according to one embodiment of the present invention. HFET 64 includes gallium nitride material device region 14 formed on non-conducting layer 15. Non-conducting layer 15 may be compositionally-graded and is formed on silicon substrate 12. In the illustrative embodiment, the following layers comprise gallium nitride material device region 14 in succession: an intrinsic GaN layer 66 and an intrinsic AlGaN region 68. Via 24 extends from backside 22 to a position within GaN layer 66. HFET 64 includes a source topside contact 16a, a gate topside contact 16b, and a drain topside contact 16c. A backside gate contact 20 is formed within via 24. It should be understood that HFETs having a variety of different structures may also be provided including HFETs having a plurality of gates.

FIG. 8 illustrates an LED 70 including multiple backside vias 24a, 24b according to another embodiment of the present invention. LED 70 includes gallium nitride material device region 14 formed on non-conducting layer 15. Non-conducting layer 15 may be compositionally-graded and is formed on silicon substrate 12. In the illustrative embodiment, the following layers comprise gallium nitride material device region 14 in succession: a silicon-doped GaN layer 72, a silicon-doped $Al_xGa_{(1-x)}N$ layer 74 (containing 0–20% by weight Al), a GaN/InGaN single or multiple quantum well 76, a magnesium-doped $Al_xGa_{(1-x)}N$ layer 78 (containing 10–20% by weight Al), and a magnesium-doped GaN layer 80. Via 24a extends from backside 22 to a position within GaN layer 72 and via 24b extends from backside 22 to a position within GaN layer 80. An n-type backside contact 20a is formed within via 24a and a p-type backside contact 20b is formed within via 24b. A dielectric layer 31 isolates portions of p-type backside contact 20b to prevent shorting. It should be understood that LEDs having a variety of different structures may also be provided.

Those skilled in the art would readily appreciate that all parameters listed herein are meant to be exemplary and that the actual parameters would depend upon the specific application for which the semiconductor materials and methods of the invention are used. It is, therefore, to be understood that the foregoing embodiments are presented by way of example only and that, within the scope of the appended claims and equivalents thereto the invention may be practiced otherwise than as specifically described.

What is claimed is:

1. A semiconductor structure comprising:
   a silicon substrate having at least one via extending from a backside of the substrate;

an electrical contact formed in the via; and a gallium nitride material region formed over the substrate.

2. The semiconductor structure of claim 1, wherein the electrical contact extends from the backside of the substrate to a conducting region of the semiconductor structure.

3. The semiconductor structure of claim 2, wherein the electrical contact extends from the backside of the substrate to the gallium nitride material region.

4. The semiconductor structure of claim 1, further comprising a non-conducting layer formed between the substrate and the gallium nitride material region.

5. The semiconductor structure of claim 4, wherein the via is formed through the non-conducting layer and the electrical contact extends through the non-conducting layer.

6. The semiconductor structure of claim 4, wherein the non-conducting layer comprises a compositionally-graded transition layer.

7. The semiconductor structure of claim 4, wherein the via extends to a conductive portion of the compositionally-graded transition layer.

8. The semiconductor structure of claim 1, wherein the via is formed through the substrate and the electrical contact extends through the substrate.

9. The semiconductor structure of claim 1, wherein the electrical contact extends from the backside of the substrate to a region within the gallium nitride material layer.

10. The semiconductor structure of claim 1, wherein the electrical contact extends from the backside of the substrate to a source region formed within the gallium nitride material layer.

11. The semiconductor structure of claim 1, further comprising a topside electrical contact formed on a top side of the semiconductor structure.

12. The semiconductor structure of claim 11, wherein the semiconductor structure is capable of vertical conduction between the topside electrical contact and the electrical contact in the via.

13. The semiconductor structure of claim 1, wherein the semiconductor structure is capable of vertical conduction.

14. The semiconductor structure of claim 1, wherein the substrate has more than one via extending from the backside of the substrate.

15. The semiconductor structure of claim 1, wherein the via extends to an etch stop layer in the semiconductor structure.

16. The semiconductor structure of claim 1, wherein the gallium nitride material region includes at least one gallium nitride material layer.

17. The semiconductor structure of claim 1, wherein the gallium nitride material layer has a crack level of less than about 0.001 $\mu m/\mu m^2$.

18. The semiconductor structure of claim 1, wherein a semiconductor device is formed in the gallium nitride material region.

19. The semiconductor structure of claim 1, wherein the semiconductor structure comprises a laser diode.

20. The semiconductor structure of claim 1, wherein the semiconductor structure comprises an LED.

21. The semiconductor structure of claim 1, wherein the semiconductor structure comprises a FET.

22. The semiconductor structure of claim 21, wherein the via extends to a source region of the FET and the electrical contact is a source electrode.

23. The semiconductor structure of claim 21, wherein the via extends to a drain region of the FET and the electrical contact is a drain electrode.

24. The semiconductor structure of claim 21, wherein the FET includes a gate and the electrical contact is a gate electrode.

25. The semiconductor structure of claim 1, wherein the semiconductor structure comprises a power rectifier diode.

26. The semiconductor structure of claim 1, wherein the substrate comprises bulk silicon.

27. The semiconductor structure of claim 26, wherein the substrate comprises a silicon on insulator substrate.

28. The semiconductor structure of claim 1, wherein the via extends through the structure to a topside of the structure.

29. The semiconductor structure of claim 28, wherein the electrical contact forms an electrical contact at the topside of the structure.

30. The semiconductor structure of claim 1, wherein the via and the electrical contact are a heat sink.

31. The semiconductor structure of claim 1, wherein the electrical contact is light reflective.

32. The semiconductor structure of claim 1, wherein the substrate is greater than 250 microns.

33. The semiconductor structure of claim 1, wherein the structure is free of a topside contact.

34. A semiconductor structure comprising:

a substrate having a first via and a second via extending from a backside of the substrate;

a first electrical contact formed in the first via;

a second electrical contact formed in the second via; and a gallium nitride material region formed over the substrate, wherein the semiconductor structure is capable of vertical conduction between the first electrical contact and the second electrical contact.

35. The semiconductor structure of claim 34, further comprising a dielectric layer isolating a portion of the second electrical contact.

36. A semiconductor structure comprising:

a silicon substrate having at least one via extending from a backside of the silicon substrate; and a gallium nitride material region formed over the silicon substrate.

37. The semiconductor structure of claim 36, wherein the via extends from the backside of the silicon substrate to a conducting region of the semiconductor structure.

38. The semiconductor structure of claim 36, wherein the via extends from the backside of the silicon substrate to the gallium nitride material region.

39. The semiconductor structure of claim 36, further comprising a non-conducting layer formed between the substrate and the gallium nitride material region.

40. The semiconductor structure of claim 39, wherein the via extends through the non-conducting layer.

41. The semiconductor structure of claim 36, wherein the via is formed through the silicon substrate.

42. The semiconductor structure of claim 36, wherein an electrical contact is formed in the via.

43. The semiconductor structure of claim 42, wherein a topside electrical contact is formed on a topside of the device and the semiconductor structure is capable of vertical conduction between the topside electrical contact and the electrical contact formed in the via.

44. The semiconductor structure of claim 36, wherein the silicon substrate has more than one via extending from the backside of the silicon substrate.

45. A vertically conducting semiconductor device comprising:

a silicon substrate; and a gallium nitride material region formed over the silicon substrate, wherein the semiconductor device is capable of vertical conduction.

46. The semiconductor device of claim 45, further comprising a non-conducting layer between the silicon substrate and the gallium nitride material layer.

47. The semiconductor device of claim 45, further comprising a backside electrical contact formed on a backside of the device, the backside electrical contact not extending onto sides of the semiconductor device.

48. The semiconductor device of claim 47, further comprising a topside electrical contact formed on a topside of the device, and the semiconductor device being capable of vertical conduction between the topside electrical contact and the backside electrical contact.

49. A semiconductor structure comprising:

a silicon substrate;

a gallium nitride material region formed over the silicon substrate;

a non-conducting layer formed between the gallium nitride material region and the silicon substrate;

an electrical contact formed within a via extending from a backside of the semiconductor structure through the non-conducting layer.

50. The semiconductor structure of claim 49, further comprising a topside electrical contact on a topside surface of the semiconductor structure.

51. The semiconductor structure of claim 49, wherein the semiconductor device is capable of vertical conduction between the topside electrical contact and the backside electrical contact.

* * * * *